United States Patent
Fan

(10) Patent No.: US 10,424,701 B2
(45) Date of Patent: Sep. 24, 2019

(54) QUANTUM DOT (QD) LEDS, BACKLIGHT MODULES AND DISPLAYS

(71) Applicant: HUIZHOU CHINA STAR OPTOELECTRONICS TECHNOLOGY CO., LTD., Huizhou Guangdong (CN)

(72) Inventor: Yong Fan, Huizhou Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 0 days.

(21) Appl. No.: 16/008,807

(22) Filed: Jun. 14, 2018

(65) Prior Publication Data

US 2019/0237642 A1 Aug. 1, 2019

Related U.S. Application Data

(63) Continuation of application No. PCT/CN2018/078912, filed on Mar. 14, 2018.

(30) Foreign Application Priority Data

Jan. 31, 2018 (CN) .......................... 2018 1 0094907

(51) Int. Cl.
*H01L 33/58* (2010.01)
*H01L 33/52* (2010.01)
*H01L 33/60* (2010.01)
*H01L 33/06* (2010.01)

(52) U.S. Cl.
CPC .............. *H01L 33/58* (2013.01); *H01L 33/06* (2013.01); *H01L 33/52* (2013.01); *H01L 33/60* (2013.01)

(58) Field of Classification Search
CPC ......... H01L 33/58; H01L 33/06; H01L 33/52; H01L 33/60
See application file for complete search history.

(56) References Cited

U.S. PATENT DOCUMENTS

2016/0380170 A1* 12/2016 He ........................ G02B 6/0073
349/65

FOREIGN PATENT DOCUMENTS

CN 104062807 A 9/2014
CN 106960900 A 7/2017

\* cited by examiner

*Primary Examiner* — John P. Dulka
(74) *Attorney, Agent, or Firm* — Leong C. Lei

(57) ABSTRACT

The present disclosure relates to a quantum dot (QD) light emitting diode (LED), a backlight module, and a display. The QD LED includes a support; an LED chip; at least one optical fiber layer; and a packaging layer; wherein: the LED chip is fixed and connected with the support; the at least one optical fiber layer is disposed on the LED chip, and the at least one optical fiber layer includes optical fibers encapsulated with QDs; and the packaging layer encapsulates the at least one optical fiber layer and the chip on the support.

17 Claims, 2 Drawing Sheets

QUANTUM DOT (QD) LEDS, BACKLIGHT MODULES AND DISPLAYS

CROSS REFERENCE TO RELATED APPLICATIONS

This application is a continuing application of PCT Patent Application No. PCT/CN2018/078912, entitled "QUANTUM DOT (QD) LEDS, BACKLIGHT MODULES AND DISPLAYS", filed on Mar. 14, 2018, which claims priority to Chinese Patent Application No. 201810094907.7, filed on Jan. 31, 2018, both of which are hereby incorporated in its entireties by reference.

BACKGROUND

1. Technical Field

The present disclosure generally relates to light emitting diode (LED) lighting technology field, and especially relates to a quantum dot (QD) LED, a backlight module, and a display.

2. Description of Related Art

Due that quantum dot (QD) emits narrow-peak emission and the wavelength of the emission can be adjusted according to the dimension, it is widely applied to backlight products nowadays. However, if the QDs are exposed in the water and oxygen condition, the fluorescence-efficiency will decay rapidly and irreversibly. Therefore, the package of the QDs needs to be isolated well against water and oxygen. The top and bottom side of the film of the conventional QDs are made by PET that has isolated film. To provide the film of the QDs stable optical characteristics and lifetime, it needs that the isolated film has oxygen permeability to meet 0.1 cc/m2-day and has water permeability to meet 0.1 g/m2-day. In addition, due that the QDs are sensitive to the temperature, when the temperature arises, the wavelength of the QDs will have red shift as well as decrease the emitting efficiency.

A conventional LED is shown in FIG. 1. By using a metal support 11 and a plastic support 12, an LED chip 13 is fixed on the metal support 11, and is connected with the metal support 11 by a gold wire 14. A phosphor and a silica gel are encapsulated by an encapsulated gel 16 on the metal support 11 and the plastic support 12. In addition, both the plastic support 12 and the encapsulated gel 16 have low heat conductivity, resulting that the temperature of the QDs increase, such that the QDs will have low emitting efficiency in the high temperature condition.

SUMMARY

The present disclosure relates to a quantum dot (QD) light emitting diode (LED), a backlight module, and a display.

In one aspect, a quantum dot (QD) light emitting diode (LED) is provided. The QD LED includes a support; an LED chip; at least one optical fiber layer; and a packaging layer; wherein: the LED chip is fixed and connected with the support; the at least one optical fiber layer is disposed on the LED chip, and the at least one optical fiber layer includes optical fibers encapsulated with QDs; and the packaging layer encapsulates the at least one optical fiber layer and the chip on the support.

Wherein the optical fibers are made by silicon dioxide.

Wherein the at least one optical fiber layer is stacked arrangement.

Wherein the at least one optical fiber layer includes at least one optical fiber, the at least one optical fiber is encapsulated with the QDs, the QDs are red QDs or green QDs; two ends of each of the at least one optical fiber are sealed, and silica gel material is disposed inside the at least one optical fiber.

Wherein the red QDs and the green QDs are spaced apart from each other within the at least one optical fiber.

Wherein the packaging layer is disposed on the support, and the packaging layer and the support cooperatively define a closed structure; and the LED chip and the at least one optical fiber are disposed inside the closed structure.

Wherein the QDs are made by at least one of Cds, CdSe, ZnS, ZnSe, InP, CuIns, CH3NH3 PbBr3 and CSPbBr3.

Wherein a white reflective cap is disposed on an outer side of the packaging layer.

In another aspect, a backlight module is provided. The backlight module uses quantum dot (QD) light emitting diode (LED) as a backlight source. The QD LED includes a support; an LED chip; at least one optical fiber layer; and a packaging layer; wherein: the LED chip is fixed and connected with the support; the at least one optical fiber layer is disposed on the LED chip, and the at least one optical fiber layer includes optical fibers encapsulated with QDs; and the packaging layer encapsulates the at least one optical fiber layer and the chip on the support.

Wherein the optical fibers are made by silicon dioxide.

Wherein the at least one optical fiber layer is stacked arrangement.

Wherein the at least one optical fiber layer includes at least one optical fiber, the at least one optical fiber is encapsulated with the QDs, the QDs are red QDs or green QDs; two ends of each of the at least one optical fiber are sealed, and silica gel material is disposed inside the at least one optical fiber.

Wherein the red QDs and the green QDs are spaced apart from each other within the at least one optical fiber.

Wherein a white reflective cap is disposed on an outer side of the packaging layer.

In another aspect, a display is provided. The display uses a backlight module. The backlight module uses quantum dot (QD) light emitting diode (LED) as a backlight source. The QD LED includes a support; an LED chip; at least one optical fiber layer; and a packaging layer; wherein: the LED chip is fixed and connected with the support; the at least one optical fiber layer is disposed on the LED chip, and the at least one optical fiber layer includes optical fibers encapsulated with QDs; and the packaging layer encapsulates the at least one optical fiber layer and the chip on the support.

Wherein the optical fibers are made by silicon dioxide.

Wherein the at least one optical fiber layer is stacked arrangement.

Wherein the at least one optical fiber layer includes at least one optical fiber, the at least one optical fiber is encapsulated with the QDs, the QDs are red QDs or green QDs; two ends of each of the at least one optical fiber are sealed, and silica gel material is disposed inside the at least one optical fiber.

Wherein the red QDs and the green QDs are spaced apart from each other within the at least one optical fiber.

In view of the above, the present disclosure uses the optical fiber encapsulated with the quantum dots (QD), so as to provide the QDs the environment of low oxygen permeability, low water permeability, and high heat conductivity, such that the QDs can provide high emitting efficiency.

DETAILED DESCRIPTION

Figure 1:
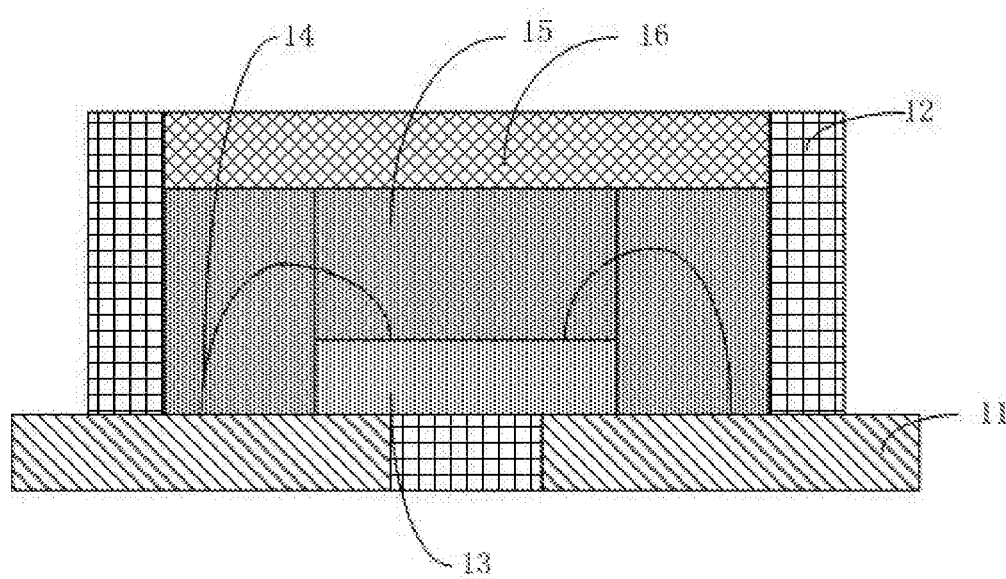
FIG. 1 is a schematic diagram of a conventional LED package.

Following embodiments of the invention will now be described in detail hereinafter with reference to the accompanying drawings.

In the drawings, the thicknesses of layers and regions may be exaggerated for clarity. Same reference numerals refer to the same components throughout the specification and the drawings.

The above description is merely the embodiments in the present disclosure, the claim is not limited to the description thereby. The equivalent structure or changing of the process of the content of the description and the figures, or to implement to other technical field directly or indirectly should be included in the claim.

The present disclosure utilizes optical fibers that are made by silicon dioxide to encapsulate quantum dots (QDs), as so to provide the QDs the environment of low oxygen permeability and low permeability, such that the temperature of the QDs cannot increase to affect emitting efficiency. Embodiments of the disclosure will now be described more fully hereinafter with reference to the accompanying drawings, in which embodiments of the disclosure are shown.

Figure 2:
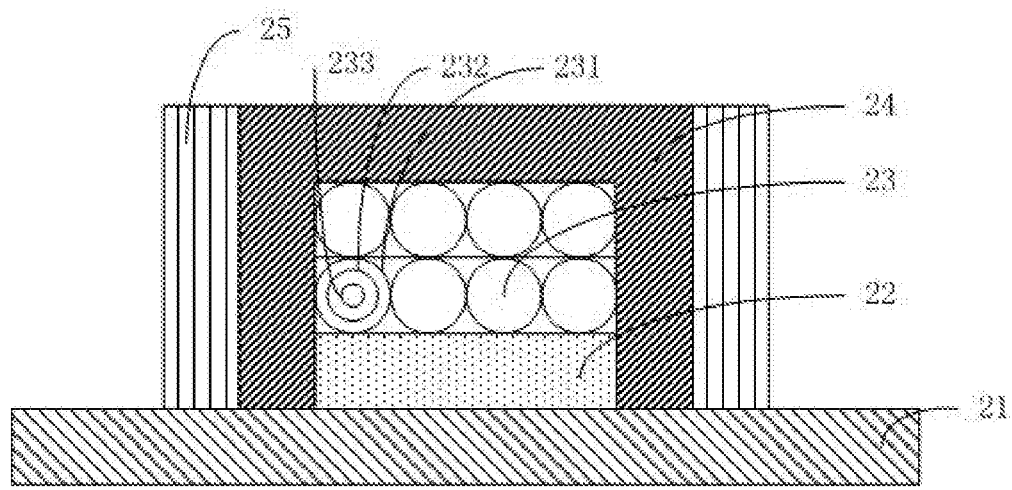
FIG. 2 is a schematic diagram of a QD LED package in accordance with one embodiment of the present disclosure.

In one embodiment of the disclosure, as shown in FIG. 2, a quantum dot (QD) light emitting diode (LED) is provided. The QD LED includes a support 21, an LED chip 22 that is fixed on the support 21, an optical fiber layer 23, a packaging layer 24, and a white reflective cap 25.

Wherein the support 21 and the LED chip 22 fixed on the support 21 may be connected each other by a gold wire, or a contact is disposed directly on the support 21 and the LED chip 22, such that the support 21 and the LED chip 22 can be connected directly with each other. The support 21 may be a metal support, a ceramics support, or other polymer material of support.

At least one optical fiber layer 23 is disposed on the LED chip 22. In order to achieve better emitting efficiency, the optical fiber layers are stacked together. Each of the optical fiber layers includes at least one optical fiber 231. In normal condition, each of the optical fiber layers includes a plurality of optical fibers. The purpose of the optical fibers is to provide the uniformity of the light distribution for the QDs. The QDs 233 is encapsulated by the optical fiber 231. The QDs 233 may be red QDs or green QDs. In order to fix the position of the QDs, silica gel material 232 is disposed inside the optical fiber 231. By heating the silica gel material to be cured, the position of the QD is fixed. In order to insulate the QD against water and air, and to provide high heat conductivity, the optical fiber is made by silicon dioxide, and two ends of each of the optical fiber are sealed.

In the embodiment, the material of the QDs 233 can be chosen. The QDs 233 may be made by one or more of CdS, CdSe, ZnS, ZnSe, InP, CuInS, CH3NH3 PbBr3 and CSPbBr3.

Furthermore, in one optical fiber layer, the red QDs and the green QDs are spaced apart from each other within the at least one optical fiber to provide the light high and pure color.

The packaging layer 24 may be made by the gel. By the curing of the gel, the LED chip 22 and the optical fiber 23 are encapsulated on the support 21. In another embodiment, other materials can be used, such that the LED chip 22 and the optical fiber 23 are encapsulated on the support 21. It can be chosen as the material can fix the optical layer 23 and is a transparent material.

In order to achieve better emitting effect, a white reflective cap 25 may be disposed on the lateral side of the packaging layer 24, so as to reflect optimally the white light, such that the QD LED has better light emitting efficiency.

In another embodiment, a backlight module is provided. The backlight module uses the QD LED as a backlight source. The detailed description of the QD LED can be referred the description in FIG. 2, and is omitted herein.

In another embodiment, a display is provided. The display uses the backlight module. The backlight module uses the QD LED as a backlight source. The detailed description of the QD LED can be referred the description in FIG. 2, and is omitted herein.

In view of the above, the present disclosure uses quantum dots (QDs) to be a package of the optical fiber, so as to provide the QD the environment of low oxygen permeability, low water permeability, and high heat conductivity, such that the QD can provide high emitting efficiency.

For the skilled in the art, it is clear that the disclosure is not limited to the details of an exemplary embodiment. And without departing from the spirit or essential characteristics of the present disclosure, it is possible to realize the disclosure with other specific forms. Therefore, no matter with any points, it should be seen as an exemplary embodiment, but not limiting, the scope of the present disclosure is defined by the appended claims rather than the foregoing description define, and therefore intended to fall claim All changes which come within the meaning and range of equivalents of the elements to include in the present invention.

What is claimed is:

1. A quantum dot (QD) light emitting diode (LED), comprising:
   a support;
   an LED chip;
   at least one optical fiber layer; and
   a packaging layer;
   wherein:
   the LED chip is fixed and connected with the support;
   the at least one optical fiber layer is disposed on the LED chip, and the at least one optical fiber layer comprises optical fibers surrounding QDs; and
   the packaging layer encapsulates the at least one optical fiber layer and the chip on the support;
   the optical fibers are made by silicon dioxide.

2. The QD LED as claimed in claim 1, wherein the at least one optical fiber layer is stacked together.

3. The QD LED as claimed in claim 1, wherein the at least one optical fiber layer comprises at least one optical fiber, the at least one optical fiber surrounds the QDs, the QDs are red QDs or green QDs;
   two ends of each of the at least one optical fiber are sealed, and silica gel material is disposed inside the at least one optical fiber.

4. The OD LED as claimed in claim 3, wherein the red QDs and the green QDs are spaced apart from each other within the at least one optical fiber.

5. The QD LED as claimed in claim 4, wherein the packaging layer is disposed on the support, and the packaging layer and the support cooperatively define a closed structure; and the LED chip and the at least one optical fiber are disposed inside the closed structure.

6. The OD LED as claimed in claim 3, wherein the QDs are made by at least one of Cds, CdSe, ZnS, ZnSe, InP, CuIns, CH3NH3 PbBr3 and CSPbBr3.

7. The QD LED as claimed in claim 1, wherein a white reflective cap is disposed on an outer side of the packaging layer.

8. A backlight module, wherein quantum dot (QD) light emitting diodes (LEDs) are adopted as a backlight source, and the QD LEDs comprising:
    a support;
    an LED chip;
    at least one optical fiber layer; and
    a packaging layer;
    wherein:
    the LED chip is fixed and connected with the support;
    the at least one optical fiber layer is disposed on the LED chip, and the at least one optical fiber layer comprises optical fibers surrounding QDs; and
    the packaging layer encapsulates the at least one optical fiber layer and the chip on the support;
    the optical fibers are made by silicon dioxide.

9. The backlight module as claimed in claim 8, wherein the at least one optical fiber layer is stacked together.

10. The backlight module as claimed in claim 8, wherein the at least one optical fiber layer comprises at least one optical fiber, the at least one optical fiber surrounding the QDs, the QDs are red QDs or green QDs;
    two ends of each of the at least one optical fiber are sealed, and silica gel material is disposed inside the at least one optical fiber.

11. The backlight module as claimed in claim 10, wherein the red QDs and the green QDs are spaced apart from each other within the at least one optical fiber.

12. The backlight module as claimed in claim 8, wherein a white reflective cap is disposed on an outer side of the packaging layer.

13. A display comprises a backlight module, wherein quantum dot (QD) light emitting diodes (LEDs) are adopted as a backlight source of the backlight module, and the QD LEDs comprising:
    a support;
    an LED chip;
    at least one optical fiber layer; and
    a packaging layer;
    wherein:
    the LED chip is fixed and connected with the support;
    the at least one optical fiber layer is disposed on the LED chip, and the at least one optical fiber layer comprises optical fibers surrounding QDs; and
    the packaging layer encapsulates the at least one optical fiber layer and the chip on the support;
    the optical fibers are made by silicon dioxide.

14. The display as claimed in claim 13, wherein the at least one optical fiber layer is stacked together.

15. The display as claimed in claim 13, wherein the at least one optical fiber layer comprises at least one optical fiber, the at least one optical fiber surrounds the QDs, the QDs are red QDs or green QDs;
    two ends of each of the at least one optical fiber are sealed, and silica gel material is disposed inside the at least one optical fiber.

16. The display as claimed in claim 15, wherein the red QDs and the green QDs are spaced apart from each other within the at least one optical fiber.

17. The display as claimed in claim 13, wherein a white reflective cap is disposed on an outer side of the packaging layer.

\* \* \* \* \*